United States Patent
Yamada et al.

(10) Patent No.: US 6,432,803 B1
(45) Date of Patent: Aug. 13, 2002

(54) SEMICONDUCTOR DEVICE AND METHOD OF FABRICATING THE SAME

(75) Inventors: Takayuki Yamada; Masaru Moriwaki, both of Osaka (JP)

(73) Assignee: Matsushita Electric Industrial Co., Inc., Osaka (JP)

( * ) Notice: Subject to any disclaimer, the term of this patent is extended or adjusted under 35 U.S.C. 154(b) by 0 days.

(21) Appl. No.: 09/452,460

(22) Filed: Dec. 2, 1999

(30) Foreign Application Priority Data

Dec. 14, 1998 (JP) .......................................... 10-354127

(51) Int. Cl.[7] .......................................... H01L 21/4763
(52) U.S. Cl. ........................................................ 438/588
(58) Field of Search .................................. 438/585, 694, 438/722, 742, 775, 778, 785, 792, 588, 763

(56) References Cited

U.S. PATENT DOCUMENTS

| | | | |
|---|---|---|---|
| 5,907,188 A | * | 5/1999 | Nakajima et al. ............ 257/751 |
| 6,072,221 A | * | 6/2000 | Hieda .......................... 257/382 |
| 6,100,188 A | * | 8/2000 | Lu et al. ..................... 438/653 |
| 6,187,656 B1 | * | 2/2001 | Lu et al. ..................... 438/592 |

FOREIGN PATENT DOCUMENTS

| | | |
|---|---|---|
| JP | 01094664 | 4/1989 |
| JP | 02302034 | 12/1990 |
| JP | 10-233505 | 9/1998 |
| JP | 11265896 | 9/1999 |

OTHER PUBLICATIONS

Naoki Yamamoto et al., The Influence of Internal Stresses in Tungsten–Gate Electrodes on the Degradation of MOSFET Characteristics Caused by Hot Carriers, IEEE Transactions on Electron Devices, vol. ED–34, No. 3, Mar., 1987.

* cited by examiner

Primary Examiner—David Nelms
Assistant Examiner—Quoc Hoang
(74) Attorney, Agent, or Firm—Nixon Peabody LLP; Donald R. Studebaker

(57) ABSTRACT

After an insulating film, serving as a gate insulating film, is formed on a semiconductor layer formed on a substrate, a target made of tungsten is sputtered in an ambient of a gas mixture of an argon gas and a nitrogen gas. In the sputtering process, a surface region of the insulating film serving as the gate insulating film is nitrided, while a crystal mixture film composed of a mixture of a tungsten crystal and a tungsten nitride crystal is deposited on the insulating film. The crystal mixture film serves to compose at least a part of a gate electrode.

6 Claims, 16 Drawing Sheets

SEMICONDUCTOR DEVICE AND METHOD OF FABRICATING THE SAME

BACKGROUND OF THE INVENTION

The present invention relates to a semiconductor device and a fabrication method therefor and, more particularly, to a MOS transistor having a thin gate insulating film and a low-resistance gate electrode formed on the gate insulating film and a fabrication method therefor.

To implement a semiconductor device composed of a MOS transistor which is smaller in size, higher in integration, and operable with a lower voltage, it is necessary to reduce the resistances of the materials of a wire, an electrode, and the like each composing the semiconductor device and thereby reduce a delay time resulting from wiring resistance.

Accordingly, a multilayer film composed of a polysilicon film and a metal silicide film has been used for the gate electrode of the MOS transistor.

In a MOS transistor with an extremely small design rule of 0.10 μm or less, however, a sufficiently reduced resistance can not be obtained with the gate electrode formed of the multilayer film composed of the polysilicon film and the metal silicide film. As a substitute, therefore, a metal gate process has been considered in which the gate electrode is formed of a refractory metal film such as a tungsten film.

Referring to FIGS. 15(a), (b), (c), and (d), a method of fabricating a semiconductor device according to a first conventional embodiment will be described, in which the gate electrode is formed by the metal gate process.

First, as shown in FIG. 15(a), an insulating film 11 for isolation and a p-type semiconductor region 12 are formed successively in a surface portion of a semiconductor substrate 10. A silicon oxide film 13, serving as a gate insulating film, is then formed on a region of the semiconductor substrate 10 surrounded by the insulating film 11 for isolation. Thereafter, a target made of tungsten is sputtered in an argon ambient, whereby a tungsten film 14 serving as a gate electrode is deposited over the entire surface of the semiconductor substrate 10.

Next, as shown in FIG. 15(b), a resist pattern 15 is formed on a region of the tungsten film 14 in which a gate electrode is to be formed. Then, as shown in FIG. 15(c), the tungsten film 14 and the silicon oxide film 13 masked with the resist pattern 15 is etched to form a gate electrode 14A and a gate oxide film 13A.

Next, as shown in FIG. 15(d), an n-type lightly doped region 16 is formed by implanting an n-type dopant by using the gate electrode 14A as a mask, followed by sidewalls 17 formed on the side surfaces of the gate electrode 14A. Thereafter, an n-type heavily doped region 18 is formed by implanting an n-type dopant by using the gate electrode 14A and sidewalls 17 as a mask. A heat treatment is then performed to activate the n-type lightly doped region 16 and the n-type heavily doped region 18.

Next, contacts, metal wires, and the like are formed, though they are not shown in the drawing. As a result, the semiconductor device having the gate electrode 13A made of tungsten is obtained.

It has been reported that, if the heat treatment is performed in a nitrogen ambient at a temperature of 900 to 1100° C. for about 30 minutes after the formation of the gate electrode 14A composed of the tungsten film 13, the internal stress of the gate electrode 14A can be reduced and the reliability of the MOS transistor is improved thereby (N. Yamamoto, S. Iwata, and H. Kume, "The influence of Internal Stresses in Tungsten-Gate Electrodes on the Degradation of MOSFET Characteristics Caused by Hot Carriers: IEEE Trans, Electron Device, vol. ED-34, pp. 607–614 1987).

Hereinafter, a second conventional embodiment of the method of fabricating a semiconductor device disclosed in Japanese Unexamined Patent Publication No. 10-233505 will be described, in which the gate electrode is formed by the metal gate process.

In the second conventional embodiment, a nitrogen-containing tungsten film composed of a composite of tungsten and tungsten nitride is formed on a gate insulating film by sputtering a target made of tungsten in a nitrogen ambient. A heat treatment is then performed with respect to the nitrogen-containing tungsten film to diffuse nitrogen contained in the nitrogen-containing tungsten film, thereby preventing the reliability of the gate insulating film from deteriorating.

Since further scaling down of a semiconductor integrated circuit requires a thinner gate insulating film, the achievement of higher reliability is becoming increasingly important in a MOS transistor having an extremely thin gate insulating film. It is also known that the material of the gate electrode greatly affects the reliability of the gate insulating film.

In the case where the tungsten film is used for the gate electrode, as in the first conventional embodiment, the heat treatment for reducing the internal stress of the gate electrode should be performed, so that the internal stress of the gate electrode changes as a crystal grows within the tungsten film composing the gate electrode. As a result, a mechanical stress is exerted on the gate insulating film adjacent the gate electrode, which causes a new problem of reduced reliability of the gate insulating film. When the gate insulating film is extremely thin, in particular, the deterioration of the gate insulating film caused by the heat treatment is remarkable.

FIGS. 16(a) and (b) show the results of a TDDB (Time Dependent Dielectric Breakdown) evaluation performed with respect to the reliability of a gate insulating film in a MOS transistor having a gate electrode made of tungsten and a silicon oxynitride film with a thickness of 3.5 nm, of which FIG. 16(a) shows the result of Weibull-plotting the relationship between the charge-to-breakdown value ($Q_{bd}$) and the cumulative fault probability when a negative bias was applied to the gate electrode and FIG. 16(b) shows the result of Weibull-plotting the relationship between the value $Q_{bd}$ and the cumulative fault probability when a positive bias was applied to the gate electrode. For comparison, there is also shown the case where a gate electrode made of polysilicon is used.

As can be seen from FIG. 16(a), the value $Q_{bd}$ when the negative bias was applied to the gate electrode is higher with the use of the gate electrode made of tungsten than with the use of the gate electrode made of polysilicon. As can be seen from FIG. 16(b), the value $Q_{bd}$ when the positive bias was applied to the gate electrode is lower with the use of the gate electrode made of tungsten than with the use of the gate electrode made of polysilicon.

Thus, in the MOS transistor having the gate electrode made of tungsten and the extremely thin gate insulating film with a thickness of about 3.5 nm, the reliability of the gate insulating film deteriorates when the positive bias is applied to the gate electrode.

To deposit the nitrogen-containing tungsten film composed of the composite of tungsten and tungsten nitride on the gate insulating film by sputtering the target made of tungsten in the nitrogen ambient and diffuse nitrogen contained in the nitrogen-containing tungsten film, as in the second conventional embodiment, a high-temperature, long-term heat treatment should be performed at a temperature of, e.g., 900° C. for about 1 minute. In the process of high-temperature heat treatment, nitrogen leaves the gate electrode and the internal stress of the gate electrode changes, while the mechanical stress is exerted on the gate insulating film adjacent the gate electrode. Therefore, the process is not satisfactory in terms of preventing the deterioration of the reliability of the gate insulating film.

In addition, the high-temperature heat treatment for diffusing nitrogen causes another problem of adversely affecting an element formed on the semiconductor substrate, such as a transistor. In particular, a MOS transistor with an extremely small design rule of 0.10 m or less may have its characteristics significantly changed by the high-temperature heat treatment.

SUMMARY OF THE INVENTION

In view of the foregoing, it is therefore an object of the present invention to provide a MOS transistor having a gate electrode containing tungsten and an extremely thin gate insulating film with improved reliability without performing a heat treatment.

The present invention has been achieved based on the findings that, if a target made of tungsten is sputtered in an ambient of a gas mixture of an argon gas and a nitrogen gas, a crystal mixture film composed of a mixture of a tungsten crystal and a tungsten nitride crystal can be formed and a heat treatment for reducing the internal stress of the crystal mixture film is no longer necessary and that, if sputtering is performed in an ambient containing a nitrogen gas having a proper partial pressure, a dangling bond formed in a gate insulating film during sputtering is terminated by nitrogen and hence the defect density can be reduced.

Specifically, a method of fabricating a semiconductor device according to the present invention comprises the steps of: forming an insulating film, serving as a gate insulating film, on a semiconductor layer formed on a substrate; and sputtering a target made of tungsten in an ambient of a gas mixture of an argon gas and a nitrogen gas to nitride a surface region of the insulating film and deposit, on the insulating film, a crystal mixture film composed of a mixture of a tungsten crystal and a tungsten nitride crystal and composing at least a part of a gate electrode.

In accordance with the method of fabricating a semiconductor device of the present invention, the target made of tungsten is sputtered in the ambient of the gas mixture of the argon gas and the nitrogen gas. As a result, the nitrogen ions contained in a plasma derived from the nitrogen gas enter the surface region of the insulating film (gate insulating film) so that the surface region is nitrided. Since the surface region of the insulating film, which has been damaged upon collision with tungsten, recovers during the nitriding of the surface region, the reliability of the gate insulating film can be prevented from deteriorating when the positive bias is applied to the gate electrode.

Moreover, since the crystal mixture film composed of the mixture of the tungsten crystal and the tungsten nitride crystal is deposited by sputtering the target made of tungsten in the ambient of the gas mixture of the argon gas and the nitrogen gas, it becomes possible to prevent the changing of the gate electrode from the amorphous state to the crystallized state or the changing of the internal stress of the gate electrode as has been caused by the conventional high-temperature heat treatment. This eliminates the possibility that the mechanical stress is exerted on the gate insulating film and surely improves the reliability of the gate insulating film.

In the method of fabricating a semiconductor device of the present invention, the step of depositing the crystal mixture film is preferably conducted while the substrate is held at 200° C. to 500° C.

This ensures the crystallization of the tungsten and tungsten nitride composing the crystal mixture film when the crystal mixture film is deposited through sputtering in the ambient of the gas mixture of the argon gas and the nitrogen gas.

In the method of fabricating a semiconductor device of the present invention, the step of depositing the crystal mixture film is preferably conducted in the ambient of the gas mixture of the argon gas and the nitrogen gas such that the weight ratio of nitrogen contained in the crystal mixture film is 10% or less.

Since the tungsten and tungsten nitride composing the crystal mixture film are in the crystallized state, the structure of the crystal mixture film is prevented from changing from the amorphous state to the crystallized state in the step of heat treatment subsequently performed. This prevents the gate insulating film from receiving the mechanical stress resulting from the changing of the structure of the crystal mixture film and thereby improves the reliability of the gate insulating film. This also prevents excess nitrogen from being mixed in the gate insulating film during the deposition of the crystal mixture film as well as an increase in the density of defects produced at the surface of the gate insulating film in contact with the crystal mixture film (gate electrode).

In the method of fabricating a semiconductor device of the present invention, the amount of nitrogen incorporated into the surface region of the insulating film during the step of depositing the crystal mixture film is preferably 1% to 3%.

The arrangement elongates the lifespan of the gate insulating film and reduces the gate leakage current, while preventing an increase in the density of defects at the surface of the gate insulating film in contact with the crystal mixture film (gate electrode).

Preferably, the method of fabricating a semiconductor device of the present invention further comprises, after the step of depositing the crystal mixture film, the step of sputtering the target made of tungsten to deposit, on the crystal mixture film, a tungsten film having a thickness larger than that of the crystal mixture film and composing a part of the gate electrode.

This allows the formation of the gate electrode having a two-layer structure composed of the crystal mixture film and the tungsten film. The resulting gate electrode has reduced resistance compared with the gate electrode composed only of the crystal mixture film and improved reliability compared with the gate electrode composed only of the tungsten film.

In this case, since the tungsten film is deposited by sputtering the target made of tungsten in the ambient of the argon gas, the crystal mixture film and the tungsten film can be deposited continuously by merely changing the atmospheric gas in a chamber. Accordingly, throughput is not reduced compared with the case where the gate electrode composed only of the crystal mixture film is formed.

When the method of fabricating a semiconductor device further comprises the step of depositing the tungsten film, it preferably comprises, after the step of depositing the tungsten film, the step of performing a CVD or sputtering process at a temperature of 500° C. or less to deposit, on the tungsten film, an upper insulating film serving as a mask pattern for forming the gate electrode.

In forming the gate electrode having the two-layer structure composed of the crystal mixture film and the tungsten film, the mask pattern for etching the multilayer structure composed of the crystal mixture film and the tungsten film is required. In this case, if the upper insulating film forming the mask pattern is deposited at a temperature of 500° C. or lower, the heat during the deposition of the upper insulating film prevents the production of electric defects in the gate insulating film.

Preferably, the method of fabricating a semiconductor device of the present invention further comprises the steps of: sputtering the target made of tungsten in an ambient of the argon gas to deposit, on the crystal mixture film, a first tungsten film composing a part of the gate electrode; sputtering the target made of tungsten in the ambient of the gas mixture of the argon gas and the nitrogen gas to deposit, on the first tungsten film, an upper crystal mixture film composed of the mixture of the tungsten crystal and the tungsten nitride crystal and composing a part of the gate electrode; and sputtering the target made of tungsten in the ambient of the argon gas to deposit, on the upper crystal mixture film, a second tungsten film composing a part of the gate electrode.

The arrangement allows the formation of the gate electrode having a four-layer structure composed of the crystal mixture film, the first tungsten film, the upper crystal mixture film, and the second tungsten film. As a result, the crystal grows individually on each of the first and second tungsten films even if a heat treatment is performed thereafter. This suppresses an increase in the diameter of a crystal grain under growth and surely prevents the deterioration of the reliability of the gate insulating film.

A semiconductor device according to the present invention comprises: a gate insulating film formed on a semiconductor layer on a substrate; and a gate electrode having a crystal mixture film deposited on the gate insulating film and composed of a mixture of a tungsten crystal and a tungsten nitride crystal.

In the semiconductor device according to the present invention, the gate electrode has the crystal mixture film composed of the mixture of the tungsten crystal and the tungsten nitride crystal, so that it is no longer necessary to perform such a high-temperature treatment as has been performed conventionally. As a result, the gate electrode is prevented from changing from the amorphous state to the crystallized state or the internal stress of the gate electrode is prevented from changing during the high-temperature heat treatment. This eliminates the possibility that the mechanical stress is exerted on the gate insulating film and surely improves the reliability of the gate insulating film.

In the semiconductor device of the present invention, the weight ratio of nitrogen contained in the crystal mixture film is preferably 10% or less.

In the arrangement, the structure of the crystal mixture film is prevented from changing from the amorphous state to the crystallized state in the heat treatment subsequently performed. This eliminates the possibility that the mechanical stress is exerted on the gate insulating film due to the changing of the structure of the crystal mixture film and surely improves the reliability of the gate insulating film.

In the semiconductor device of the present invention, the gate electrode preferably has a multilayer structure composed of the crystal mixture film and a tungsten film deposited on the crystal mixture film and having a thickness larger than that of the crystal mixture film.

This provides a gate electrode having reduced resistance compared with the gate electrode composed only of the crystal mixture film and having improved reliability compared with the gate electrode composed only of the tungsten film.

BRIEF DESCRIPTION OF THE DRAWINGS

FIGS. 3(a) and (b) are graphs indicative of the results of a TDDB evaluation performed with respect to the reliability of a gate insulating film in the semiconductor device according to the first embodiment, of which FIG. 3(a) shows the case where a negative bias was applied to the gate electrode and FIG. 3(b) shows the case where a positive bias was applied to the gate electrode;

FIGS. 16(a) and (b) are graphs indicative of the results of a TDDB evaluation performed with respect to the reliability of a gate insulating film in the conventional semiconductor device, of which FIG. 16(a) shows the case where a negative bias was applied and FIG. 16(b) shows the case where a positive bias was applied.

DETAILED DESCRIPTION OF THE INVENTION

EMBODIMENT 1

Figure 1A:
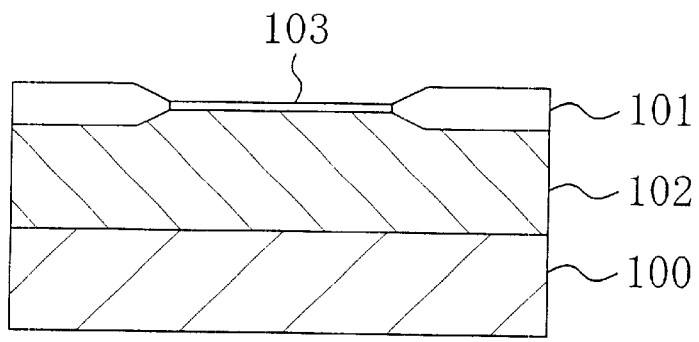
FIGS. 1(a) to (c) are cross-sectional views illustrating the individual process steps of a method of fabricating a semiconductor device according to a first embodiment of the present invention.
Figure 2A:
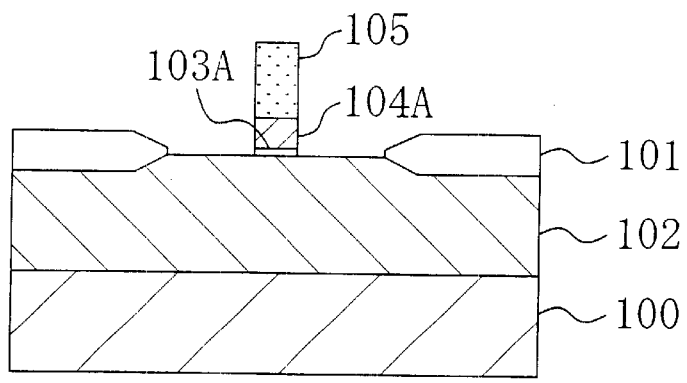
FIGS. 2(a) and (b) are cross-sectional views illustrating the individual process steps of the method of fabricating the semiconductor device according to the first embodiment.

Referring to FIGS. 1(a), (b), and (c) and FIGS. 2(a) and (b), a semiconductor device according to a first embodiment of the present invention and a fabrication method therefor will be described.

First, as shown in FIG. 1(a), an insulating film 101 for isolation and a p-type semiconductor region 102 are formed successively in a surface portion of a semiconductor substrate 100 made of silicon. A silicon oxynitride film 103 having a thickness of 3.5 nm and serving as a gate insulating film is then formed on a region of the semiconductor substrate 100 surrounded by the insulating film 101 for isolation.

Figure 1B:
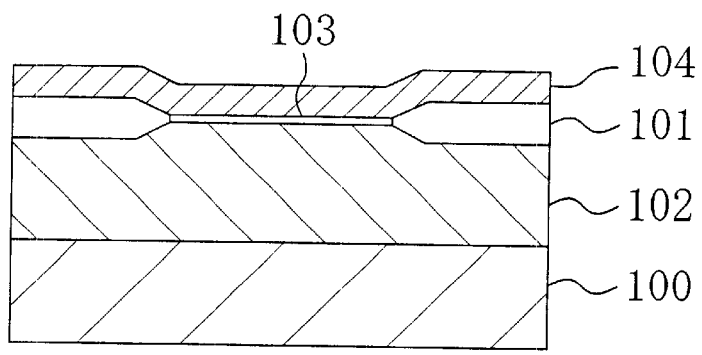

Next, a target made of tungsten is sputtered in an ambient of a gas mixture of an argon gas and a nitrogen gas in which the volume proportion (hereinafter simply referred to as the proportion) of the nitrogen gas is, e.g., 20%, while the semiconductor substrate 100 is held at about 200° C., whereby the silicon oxynitride film 103 is nitrided again and a crystal mixture film 104 composed of a mixture of a tungsten (W) crystal and a tungsten nitride ($W_2N$ or WN) crystal and having a thickness of 50 nm is deposited over the entire surface of the semiconductor substrate 100, as shown in FIG. 1(b).

Preferably, the temperature of the semiconductor substrate 100 during the deposition of the crystal mixture film 104 is in the range of 200° C. to 500° C. This ensures the crystallization of tungsten and tungsten nitride composing the crystal mixture film 104.

Figure 1C:
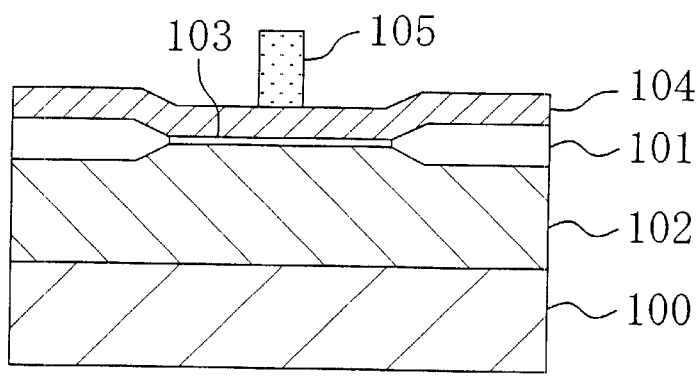

Next, as shown in FIG. 1(c), a resist pattern 105 is formed on the region of the crystal mixture film 104 in which the gate electrode is to be formed. Then, as shown in FIG. 2(a), a silicon oxynitride film 103 and the crystal mixture film 104 masked with the resist pattern 105 are etched to form the gate insulating film 103A of an NMOS transistor, which is composed of the silicon oxynitride film 103, and a gate electrode 104A of the NMOS transistor, which is composed of the crystal mixture film 104.

Figure 2B:
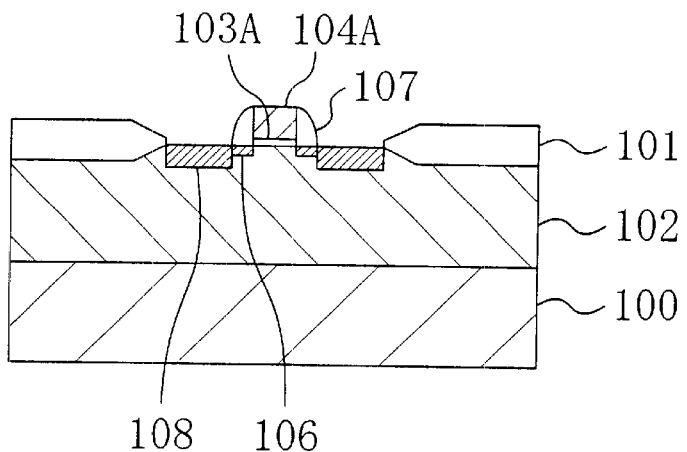

Next, as shown in FIG. 2(b), the n-type lightly doped region 106 is formed by implanting an n-type dopant by using the gate electrode 104A as a mask, followed by sidewalls 107 formed on the side surfaces of the gate electrode 104. Thereafter, the n-type heavily doped region 108 is formed by implanting an n-type dopant by using the gate electrode 104A and sidewalls 107 as a mask.

Next, a heat treatment is performed at a temperature of, e.g., 1000° C. for about 10 seconds, thereby activating the lightly doped region 106 and the highly doped region 108. After that, an interlayer insulating film, contacts, metal wires are formed, though they are not shown in the drawing. As a result, the semiconductor device according to the first embodiment is obtained.

Figure 3A:
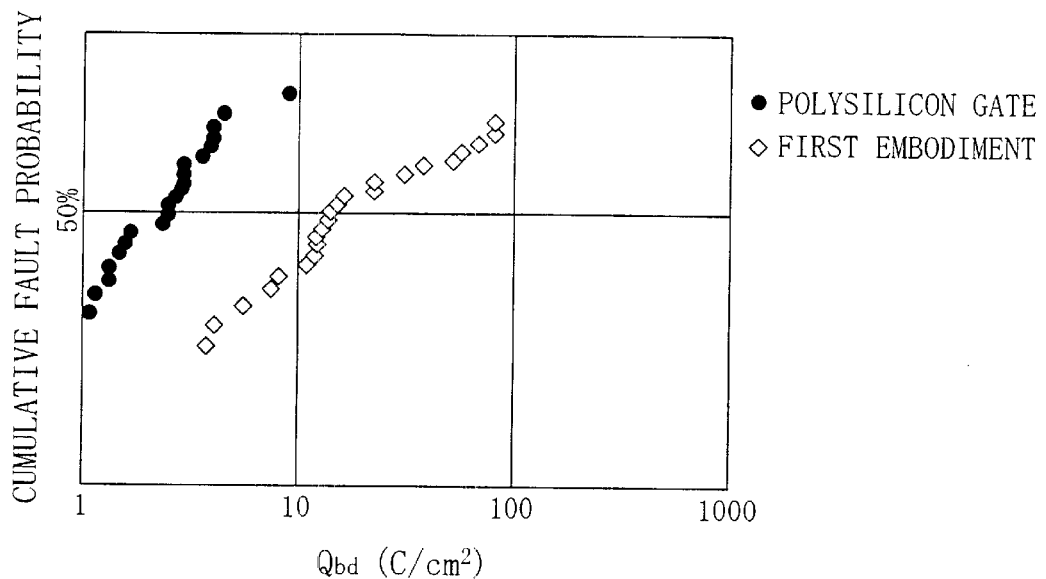
Figure 3B:
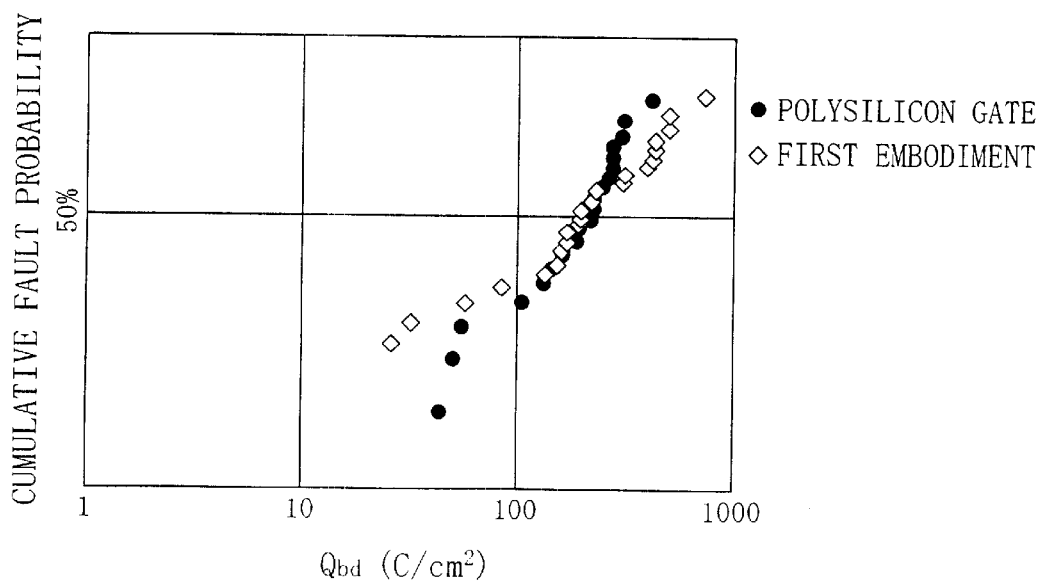

FIGS. 3(a) and (b) show the results of a TDDB evaluation performed with respect to the reliability of the gate insulating film in the semiconductor device according to the first embodiment, of which FIG. 3(a) shows the result of Weibull-plotting the relationship between the value $Q_{bd}$ and the cumulative fault probability when a negative bias was applied to the gate electrode and FIG. 3(b) shows the result of Weibull-plotting the relationship between the value $Q_{bd}$ and the cumulative fault probability when a positive bias was applied to the gate electrode. For comparison, there is also shown the case where a gate electrode made of polysilicon is used.

As can be seen from FIG. 3(a), the value $Q_{bd}$ obtained in the first embodiment when the negative bias was applied to the gate electrode is higher by about an order of magnitude than that obtained with the use of the gate electrode made of polysilicon. As can be seen from FIG. 3(b), the value $Q_{bd}$ obtained in the first embodiment when the positive bias was applied to the gate electrode is equal to that obtained with the use of the gate electrode made of polysilicon.

By thus composing the gate electrode 104A of the crystal mixture film 104 composed of a mixture of a tungsten crystal and a tungsten nitride crystal as in the first embodiment, it becomes possible to prevent the deterioration of the reliability of the gate insulating film 103A, which has presented a problem upon the application of a positive bias to the gate electrode formed of a tungsten film.

The following is the reason that the reliability of the gate insulating film 103A can be prevented from deteriorating upon the application of the positive bias to the gate electrode 104A formed of the crystal mixture film 104, which is composed of a mixture of the tungsten crystal and the tungsten nitride crystal, as in the first embodiment.

When a tungsten film, serving as a gate electrode, is deposited by sputtering a target made of tungsten, as in the first conventional embodiment, tungsten released from the target collides with the gate insulating film at the early stage of the depositing process, so that the surface portion of the gate insulating film (the surface of the gate insulating film in contact with the gate electrode) is damaged. This degrades the reliability of the gate insulating film when a positive bias is applied to the gate electrode.

By contrast, when the crystal mixture film 104 composed of the mixture of the tungsten crystal and the tungsten nitride crystal is deposited by sputtering the target made of tungsten in the ambient of the gas mixture of the argon gas and the nitrogen gas, as in the first embodiment, nitrogen ions contained in a plasma derived from the nitrogen gas enter the surface region of the gate insulating film to nitride the surface region. Since the surface region of the gate insulating film, which has been damaged upon collision with tungsten, is recovered by the nitriding process, it can be considered that the reliability of the gate insulating film is prevented from deteriorating when the positive bias is applied to the gate electrode.

Hereinafter, a description will be given to the proportion of the nitrogen gas in the ambient of the gas mixture of the argon gas and the nitrogen gas used in depositing the crystal mixture film 104 composed of the mixture of the tungsten crystal and tungsten nitride crystal.

Figure 4:
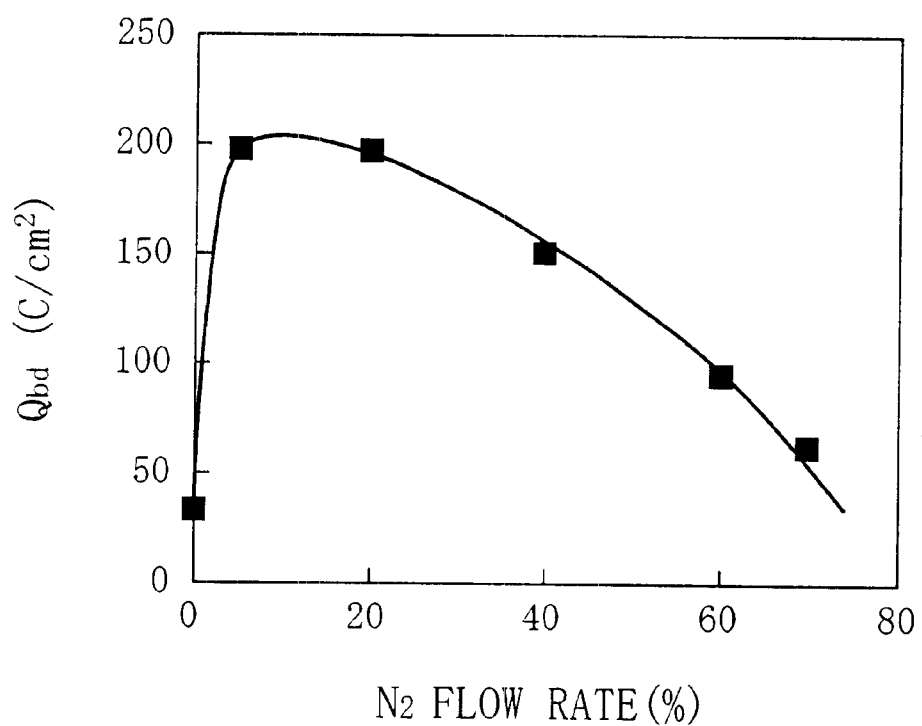
FIG. 4 is a graph showing the relationship between the proportion of a nitrogen gas in a gas mixture of an argon gas and the nitrogen gas and the value $Q_{bd}$ in the method of fabricating the semiconductor device according to the first embodiment.

FIG. 4 shows the relationship between the proportion of the nitrogen gas in the gas mixture of the argon gas and the nitrogen gas and the value $Q_{bd}$, in which a value obtained when the cumulative fault probability is 50% upon the application of the positive bias to the gate electrode is used as the value $Q_{bd}$. As can be seen from FIG. 4, the value $Q_{bd}$ increases abruptly when the proportion of the nitrogen gas is 5% to 20% compared with the case where the proportion of the nitrogen gas is 0%. On the other hand, the value $Q_{bd}$ decreases as the proportion of the nitrogen gas increases when the proportion of the nitrogen gas is 20% or more. The following is the two reasons for the decrease of the value $Q_{bd}$.

The first reason is the stress exerted by the crystal mixture film on the gate insulating film when the structure of the crystal mixture film, which is composed of the mixture of the tungsten crystal and the tungsten nitride crystal, changes to the amorphous state as the proportion of the nitrogen gas increases and changes again from the amorphous state to the crystallized state in the heat treatment performed subsequently to activate the impurity region.

The second reason is an increase in the density of defects produced at the surface of the gate insulating film in contact with the crystal mixture film (gate electrode) because excess nitrogen is mixed in the gate insulating film during the deposition of the crystal mixture film composed of the mixture of the tungsten crystal and the tungsten nitride crystal.

As will be understood from FIG. 4, the damage eliminating effect is provided by nitrogen when the proportion of the nitrogen gas is 5% or more, so that the reliability of the gate insulating film is improved compared with the first conventional embodiment in which the proportion of the nitrogen gas is 0%. If the proportion of the nitrogen gas is increased excessively, the reliability of the gate insulating film deteriorates due to the excess nitrogen mixed therein. The optimum proportion of the nitrogen is dependent on the other sputtering conditions (power, substrate temperature, and target-to-substrate distance) and preferably has a value such that the amount of nitrogen in the surface of the silicon oxynitride film (gate insulating film) 103 is approximately 1% to 3% when the crystal mixture film 104 is deposited by sputtering.

For the foregoing reasons, the first embodiment has deposited the crystal mixture film 104 composed of the mixture of the tungsten crystal and the tungsten nitride crystal in the ambient of the gas mixture of the argon gas and the nitrogen gas in which the proportion of the nitrogen gas is 20%, so that the gate insulating film 103A with high reliability is provided.

Figure 5:
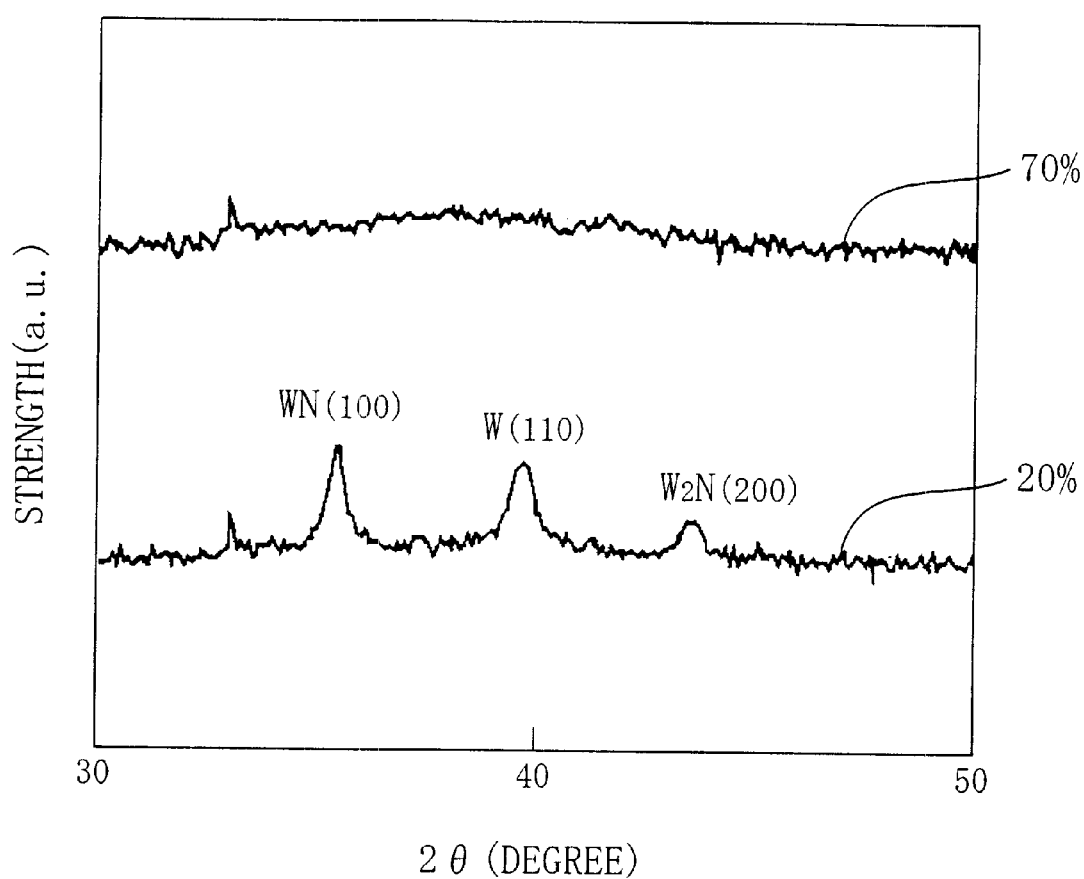
FIG. 5 is a graph indicative of the result of an X-ray diffraction evaluation performed with respect to crystal mixture films obtained when the proportion of the nitrogen gas in the gas mixture of the argon gas and the nitrogen gas was 20% and 70% in the method of fabricating the semiconductor device according to the first embodiment.
Figure 6A:
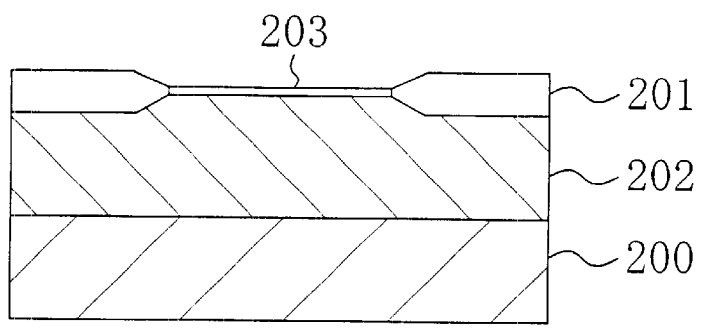
FIGS. 6(a) to (d) are cross-sectional views illustrating the individual process steps of a method of fabricating a semiconductor device according to a second embodiment of the present invention.
Figure 6B:
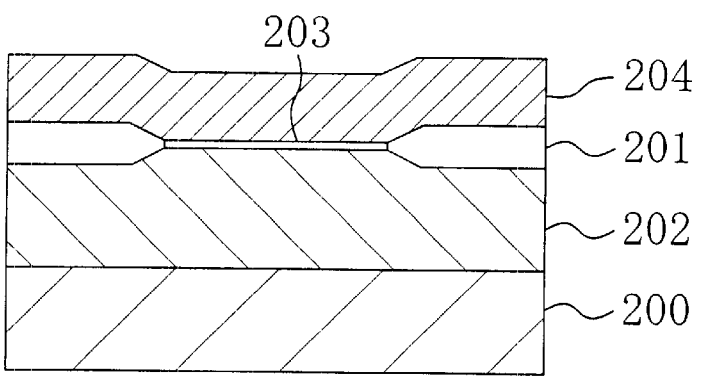
Figure 6C:
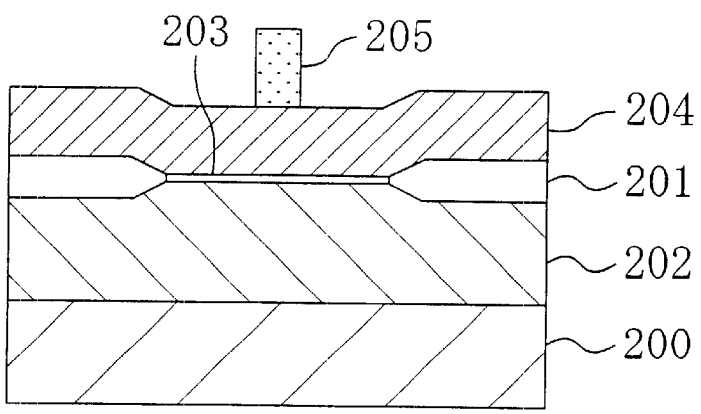
Figure 6D:
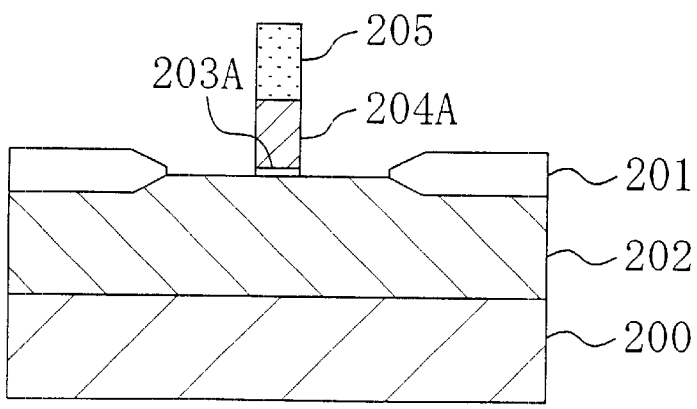

FIG. 5 shows the result of an X-ray diffraction evaluation performed with respect to the crystal mixture films 104 immediately after they were deposited in the ambient of the gas mixture in which the proportion of the nitrogen gas was 60% and in the ambient of the gas mixture in which the proportion of the nitrogen gas was 70% when RF power of 1 kW was applied to the target made of tungsten. As can be seen from FIG. 5, the crystal mixture film 104 is in the amorphous state when the proportion of the nitrogen gas is 70%, while the respective peaks of the crystals of tungsten W (110), tungsten nitride WN (100), and tungsten nitride $W_2N$ (200) are observed in the crystal mixture film 104 when the proportion of the nitrogen gas is 20%. This indicates that the crystal mixture film 104 is a film composed of a mixture of the tungsten crystal and the tungsten nitride crystal.

As a result of conducting an experiment, the present inventors have found that the crystals of tungsten W (110), tungsten nitride WN (100), and tungsten nitride $W_2N$ (200) are observed in the crystal mixture film 104 when the weight ratio of nitrogen in the crystal mixture film 104 is 10% or less. From the foregoing, it may be said that tungsten and tungsten nitride composing the crystal mixture film 104 are surely crystallized if the weight ratio of nitrogen in the crystal mixture film 104 is 10% or less.

To obtain the crystal mixture film 104 composed of the mixture of the tungsten crystal and the tungsten nitride crystal without performing a heat treatment for crystallization with respect to the deposited crystal mixture film 104, i.e., to obtain the crystal mixture film 104 composed of the mixture of the tungsten crystal and the tungsten nitride crystal immediately after the deposition, the weight ratio of nitrogen in the crystal mixture film 104 is preferably 10% or less.

EMBODIMENT 2

Referring to FIGS. 6(*a*), (*b*), (*c*), and (*d*), FIGS. 7(*a*), (*b*), and (*c*), and FIGS. 8(*a*), (*b*), and (*c*), a semiconductor device according to a second embodiment of the present invention and a fabrication method therefor will be described.

First, as shown in FIG. 6(*a*), an insulating film 201 for isolation and a p-type semiconductor region 202 are formed successively in a surface portion of a semiconductor substrate 200 made of silicon. A silicon oxide film 203 having a thickness of about 10 nm and serving as a gate insulating film is then formed on the region of the semiconductor substrate 200 surrounded by the insulating film 201 for isolation.

Next, as shown in FIG. 6(*b*), a polysilicon film 204 is deposited over the entire surface of the semiconductor substrate 200, followed by a resist pattern 205 formed on the region of the polysilicon film 204 in which a gate electrode is to be formed, as shown in FIG. 6(*c*). Subsequently, as shown in FIG. 6(*d*), the polysilicon film 204 and silicon oxide film 203 masked with the resist pattern 205 are etched, thereby forming the patterned polysilicon film 204A and silicon oxide film 203A.

Figure 7A:
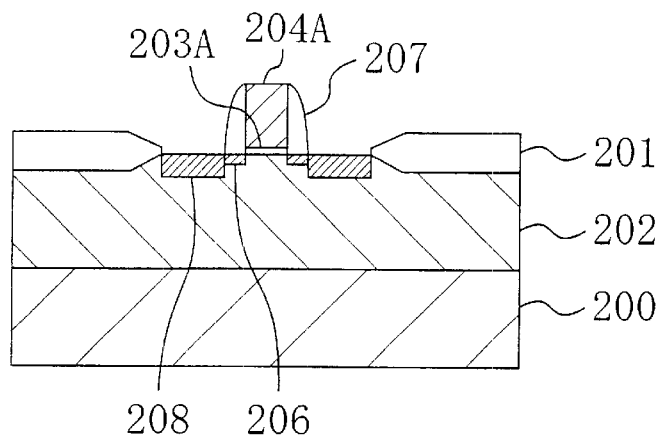
FIGS. 7(a) to (c) are cross-sectional views illustrating the individual process steps of the method of fabricating the semiconductor device according to the second embodiment.
Figure 7B:
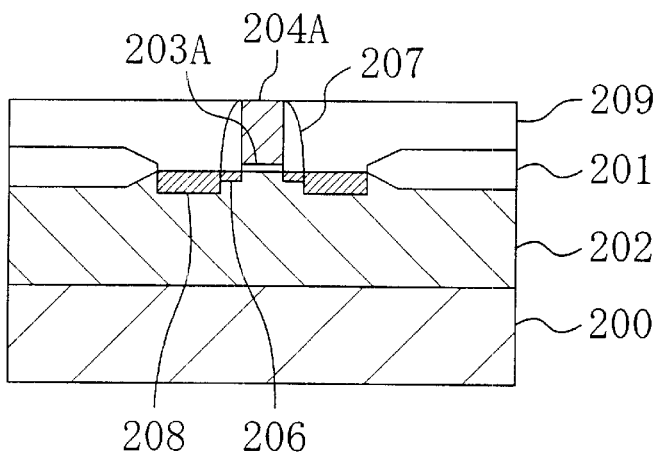
Figure 7C:
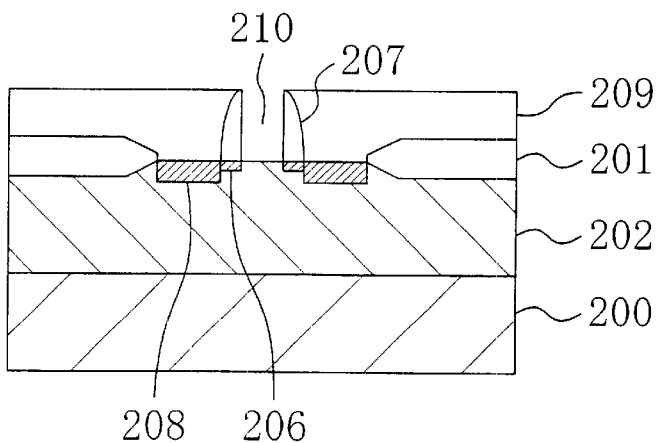

Next, as shown in FIG. 7(*a*), a lightly doped n-type region 206 is formed by implanting an n-type dopant by using the patterned polysilicon film 204A as a mask, followed by sidewalls 207 formed on the side surfaces of the patterned polysilicon film 204. Thereafter, a heavily doped n-type region 208 is formed by implanting an n-type dopant by using the patterned polysilicon film 204A and sidewalls 207 as a mask.

Next, a heat treatment is performed in an ambient of, e.g., a nitrogen gas at a temperature of 100° C. for about 10 seconds, thereby activating the lightly doped region 206 and the heavily doped region 208. Thereafter, as shown in FIG. 7(*b*), an interlayer insulating film 209 is deposited over the entire surface of the semiconductor substrate 200, which is then planarized by, e.g., CMP, while the patterned polysilicon film 204A is exposed.

Next, as shown in FIG. 7(*c*), selective etching is performed by using an alkaline solution such as KOH to remove the patterned polysilicon film 204A. Subsequently, selective etching is performed by using a solution of hydrofluoric acid to remove the patterned silicon oxide film 203A, thereby forming a depressed portion 210 in which the gate electrode is to be formed.

Figure 8A:
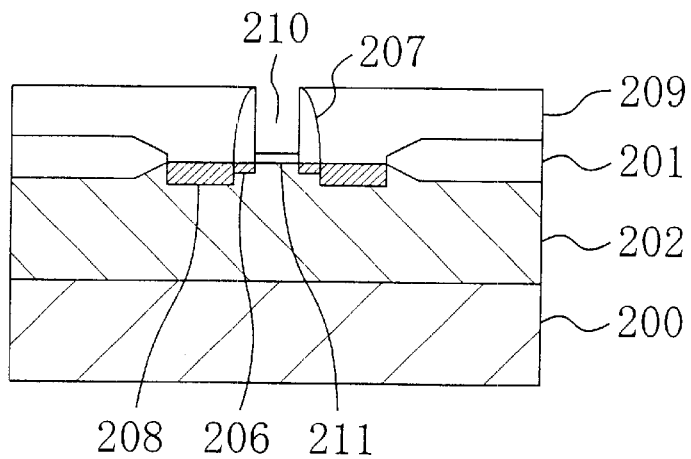
FIGS. 8(a) to (c) are cross-sectional views illustrating the individual process steps of the method of fabricating the semiconductor device according to the second embodiment.

Next, as shown in FIG. 8(a), the region of the semiconductor substrate 200 exposed in the depressed portion 210 is oxidized in an ambient containing oxygen, whereby the gate insulating film 211 of an NMOS transistor is formed on the bottom portion of the depressed portion 210.

Figure 8B:
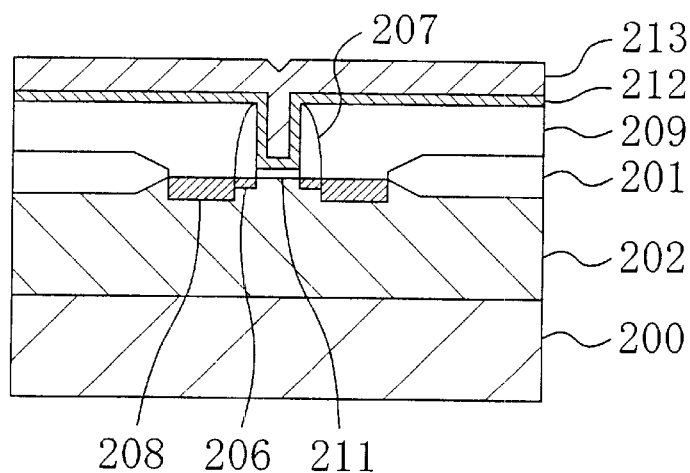

Next, a target made of tungsten is sputtered in an ambient of a gas mixture of an argon gas and a nitrogen gas in which the proportion of the nitrogen gas is, e.g., 30%, while the semiconductor substrate 200 is held at about 200° C., whereby the gate insulating film 211 is nitrided and a crystal mixture film 212 composed of a mixture of a tungsten crystal and a tungsten nitride crystal and having a thickness of 20 nm is deposited over the entire surface of the semiconductor substrate 200, as shown in FIG. 8(b). In depositing the crystal mixture film 212, the temperature of the semiconductor substrate 200 is preferably in the range of 200° C. to 500° C. This ensures the crystallization of tungsten and tungsten nitride composing the crystal mixture film 212. Thereafter, a metal film 213 with low resistance made of, e.g., aluminum is deposited over the entire surface of the crystal mixture film 212 to fill in the depressed portion 210.

Figure 8C:
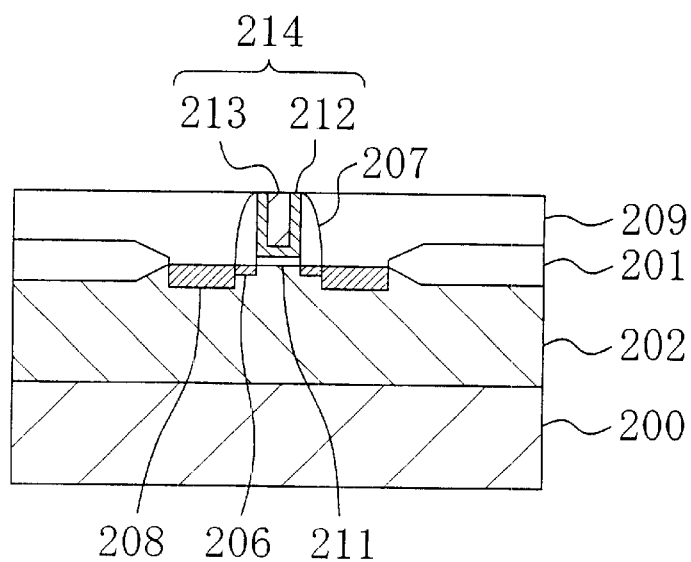

Next, the portions of the crystal mixture film 212 and metal film 213 exposed at the interlayer insulating film 209 are removed by, e.g., CMP, whereby the gate electrode 214 of the NMOS transistor composed of the crystal mixture film 212 and the metal film 213 is formed, as shown in FIG. 8(c).

Next, an interlayer insulating film, contacts, metal wires, and the like are formed, though they are not shown in the drawing. As a result, the semiconductor device according to the second embodiment is obtained.

Since the gate electrode 214 according to the second embodiment is composed of the metal film 213 made of aluminum with low resistance and the crystal mixture film 212 composed of the mixture of the tungsten crystal and the tungsten nitride crystal and covering the side and bottom surfaces of the metal film 213, the crystal mixture film 212 functions as a barrier layer for preventing aluminum atoms composing the metal film 213 from being diffused into the gate insulating film 211. Consequently, the reliability of the gate insulating film 211 is improved and the resistance of the gate electrode 214 is reduced.

EMBODIMENT 3

Figure 9A:
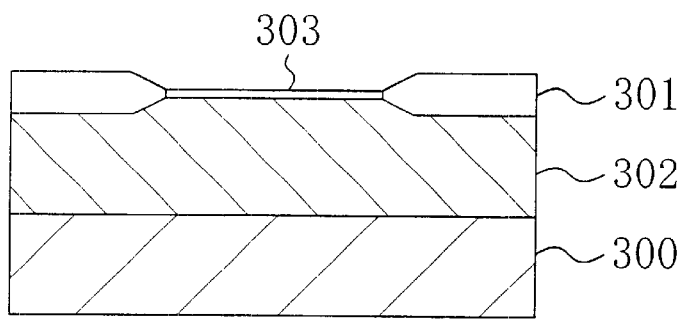
FIGS. 9(a) to (d) are cross-sectional views illustrating the individual process steps of a method of fabricating a semiconductor device according to a third embodiment of the present invention.
Figure 10A:
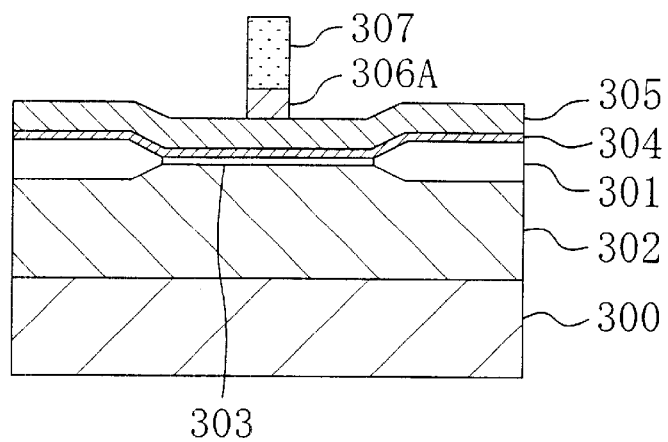
FIGS. 10(a) to (c) are cross-sectional views illustrating the individual process steps of the method of fabricating the semiconductor device according to the third embodiment.

Referring to FIGS. 9(a), (b), (c), and (d) and FIGS. 10(a), (b), and (c), a semiconductor device according to a third embodiment of the present invention and a fabrication method therefor will be described.

First, as shown in FIG. 9(a), an insulating film 301 for isolation and a p-type semiconductor region 302 are formed successively in a surface portion of a semiconductor substrate 300 made of silicon. A silicon oxynitride film 303 having a thickness of about 3.5 nm and serving as a gate insulating film is formed on the region of the semiconductor substrate 300 surrounded by the insulating film 301 for isolation.

Figure 9B:
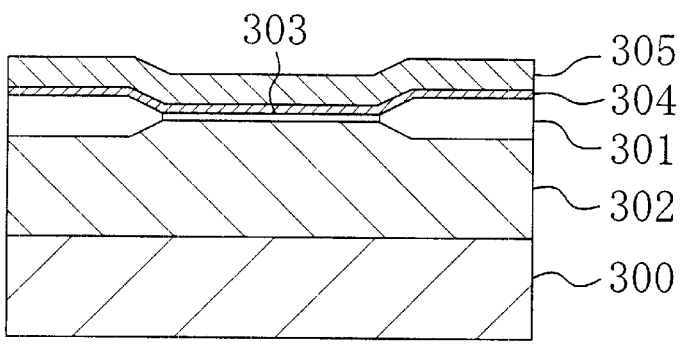

Next, a target made of tungsten is sputtered in an ambient of a gas mixture of an argon gas and a nitrogen gas in which the proportion of the nitrogen gas is, e.g., 60%, while the semiconductor substrate 300 is held at about 200° C., whereby the silicon oxynitride film 303 is nitrided again and a crystal mixture film 304 composed of a mixture of a tungsten crystal and a tungsten nitride crystal and having a thickness of 10 nm is deposited over the entire surface of the semiconductor substrate 300, as shown in FIG. 9(b). In depositing the crystal mixture film 304, the temperature of the semiconductor substrate 300 is preferably in the range of 200° C. to 500° C. This ensures the crystallization of tungsten and tungsten nitride composing the crystal mixture film 304. Thereafter, the target made of tungsten is sputtered in an ambient of the argon gas, while the semiconductor substrate 300 is held at about 200° C., whereby a tungsten film 305 having a thickness of 50 nm is deposited over the entire surface of the crystal mixture film 304.

Although the third embodiment has adjusted the thickness of the crystal mixture film 304 composing the gate electrode 308 to 10 nm, a crystal mixture film 304 composed of a continuous film with a uniform thickness can be deposited by sputtering provided that the thickness of the crystal mixture film 304 is 5 nm or more.

Figure 9C:
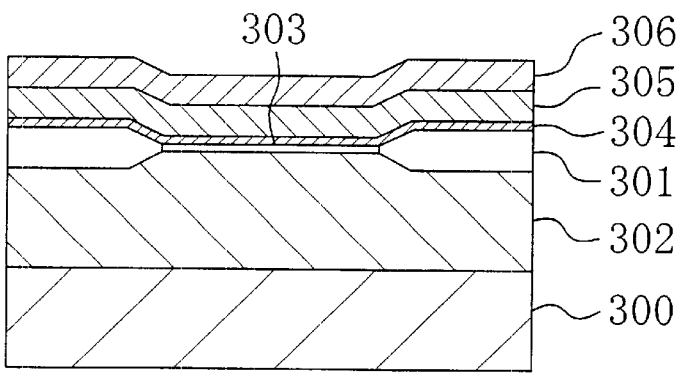

Next, as shown in FIG. 9(c), a silicon nitride film 306 is deposited over the entire surface of the tungsten film 304 by performing, e.g., plasma CVD, while the semiconductor substrate 300 is held at 400° C. In depositing the silicon nitride film 306, the temperature of the semiconductor substrate 300 is preferably 500° C. or lower. This is because, if the silicon nitride film 306 is deposited under the condition under which the temperature of the semiconductor substrate 300 is over 500° C., heat during the film deposition may cause an electric defect in the silicon oxynitride film 303 serving as the gate insulating film.

Figure 9D:
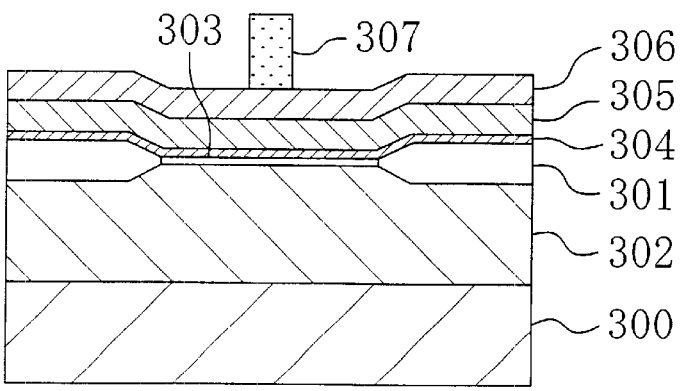

Next, as shown in FIG. 9(d), a resist pattern 307 is formed on the region of the silicon nitride film 306 in which a gate electrode is to be formed. Then, the silicon nitride film 306 masked with the resist pattern is etched to form a mask pattern 306A composed of the silicon nitride film 306, as shown in FIG. 10(a).

Figure 10B:
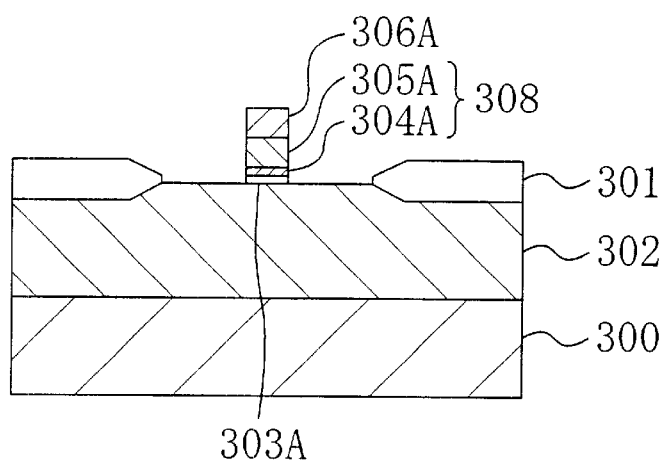

Next, as shown in FIG. 10(b), the removal of the resist pattern 307 is followed by etching performed with respect to the tungsten film 305, the crystal mixture film 304, and the silicon oxynitride film 303 by using the mask pattern 306A, whereby the gate electrode 308 of an NMOS transistor composed of the patterned tungsten film 305A and crystal mixture film 304A and the gate insulating film 303A of the NMOS transistor composed of the silicon oxynitride film 303 are formed.

Figure 10C:
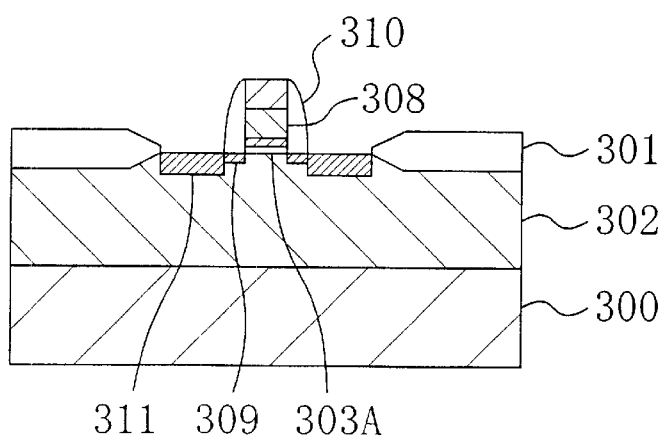

Next, as shown in FIG. 10(c), an n-type lightly doped region 309 is formed by implanting an n-type dopant by using the gate electrode 308 as a mask, followed by sidewalls 310 formed on the side surfaces of the gate electrode 308. Thereafter, an n-type heavily doped region 311 is formed by implanting an n-type dopant by using the gate electrode 308 and sidewalls 311 as a mask.

Next, an interlayer insulating film, contacts, metal wires, and the like are formed, though they are not shown in the drawing. As a result, the semiconductor device according to the third embodiment is obtained.

Figure 11A:
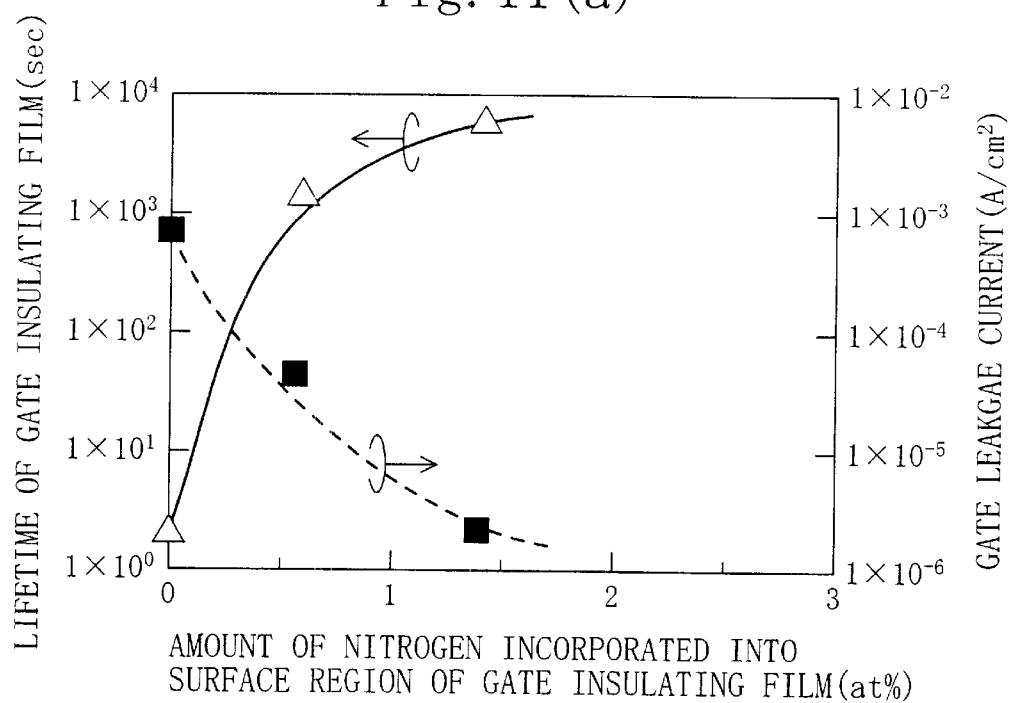
FIG. 11(a) shows the relationship among the amount of nitrogen in a surface region of a gate insulating film, the lifespan of the gate insulating film, and the gate leakage current in the semiconductor device according to the third embodiment.

FIG. 11(a) shows the relationship among the amount of nitrogen in the surface region of the gate insulating film 303A, the lifespan of the gate insulating film 303A, and the gate leakage current. As can be seen from FIG. 11(a), the gate leakage current decreases as the lifespan of the gate insulating film 303A is elongated. In the region where the amount of nitrogen is 1.4% or more, the elongation of the lifespan of the gate insulating film 303A and the decrease of the gate leakage current have reached saturation.

Accordingly, the amount of nitrogen is preferably on the order of 1.4%. However, the lifespan of the gate insulating film 303A can be elongated and the gate leakage current can be reduced if the amount of nitrogen is 1% or more. To adjust the amount of nitrogen in the gate insulating film 303A to 1.4%, the proportion of the nitrogen gas in the gas mixture used in sputtering the target made of tungsten may be adjusted appropriately to about 60%. If the proportion of the nitrogen gas is adjusted such that the amount of nitrogen in the gate insulating film 303A exceeds 3%, excess nitrogen is mixed in the gate insulating film 303A to cause an increase in the density of defects produced at the surface of the gate insulating film 303A in contact with the gate electrode 308 (crystal mixture film 304A). For the reasons stated above, the amount of nitrogen in the gate insulating film 303A is preferably in the range of 1% to 3%.

Figure 11B:
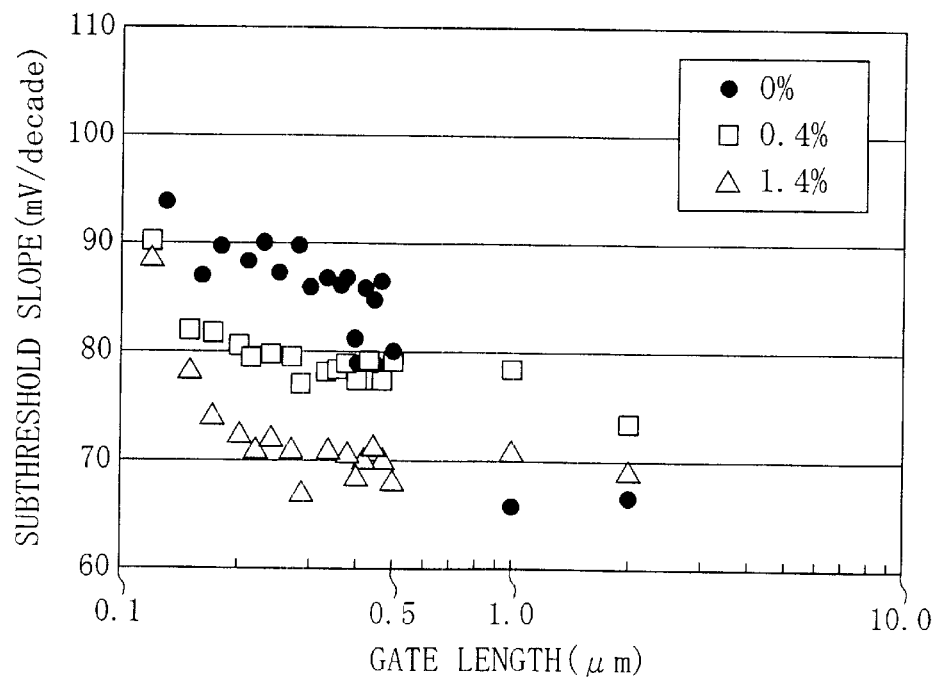
FIG. 11(b) shows the relationship between the gate length and the subthreshold slope when the amount of nitrogen in the surface region of the gate insulating film is 0%, 0.4%, and 1.4%.

FIG. 11(b) shows the relationship between the gate electrode and the subthreshold slope when the amount of nitrogen is 0%, 0.4%, and 1.4%. As can be seen from FIG. 11(b), the subthreshold slope decreases as the amount of nitrogen increases in the region where the gate length is 0.5 μm or less. When the subthreshold slope is small, the leakage current when the transistor is in the OFF state is reduced, so that the transistor has lower power consumption.

Since the gate electrode 308 according to the third embodiment has a multilayer structure consisting of the patterned tungsten film 305A and the patterned crystal mixture film 304A composed of the tungsten crystal and the tungsten nitride crystal, the resistance value thereof is reduced compared with the tungsten electrode formed only of the crystal mixture film composed of the mixture of the tungsten crystal and the tungsten nitride crystal and the reliability of the gate insulating film is improved compared with the case where the gate electrode is composed only of the tungsten film.

Since the third embodiment has deposited the crystal mixture film 304 by sputtering the target made of tungsten in the ambient of the mixture gas of the argon gas and the nitrogen gas and then has deposited the tungsten film 305 by sputtering the target made of tungsten in the ambient of the argon gas, the crystal mixture film 304 and the tungsten film 305 can be deposited continuously by merely changing the ambient in the chamber. Consequently, the gate electrode 308 with low resistance and the gate insulating film 302A with high reliability can be formed without reducing throughput.

Since the third embodiment has performed the step of depositing the silicon nitride film 306, which is to form the mask pattern 306A for forming the gate electrode 308, at a temperature of 400° C., each of the steps of depositing the crystal mixture film 304, the tungsten film 305, and the silicon nitride film 306 and the etching step for forming the gate electrode 308 can be performed at a temperature of 400° C. or lower. This suppresses electric defects caused in the gate insulating film 302A by a high-temperature heat treatment.

Figure 12:
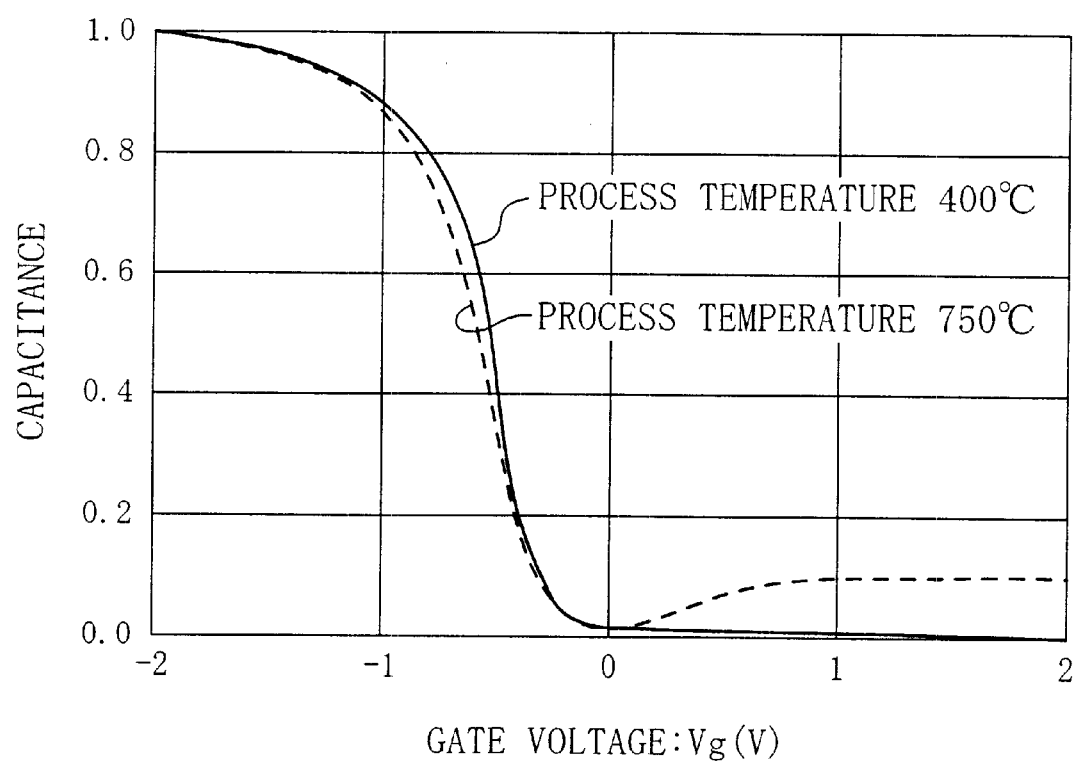
FIG. 12 shows the relationship between the gate voltage and the capacitance of the gate insulating film when a maximum temperature in the process of forming the gate electrode is 400° C. and 750° C. in the method of fabricating the semiconductor device according to the third embodiment.

FIG. 12 shows the relationship (RF C-V characteristic of insulating film) between the gate electrode and the capacitance of the gate insulating film 302A when the maximum temperature in the pre-gate-etching process up to the formation of the silicon nitride film 306 is 400° C. and 750° C. In either case, a heat treatment was performed at 750° C. after gate etching. As can be seen from FIG. 12, the capacitance value in the reversed region (Vg>0) is lower when the maximum temperature in the pre-gate-etching process is 400° C. than when it is 750° C. This indicates that, if the heat treatment is performed at 750° C. when the multilayer film consisting of the crystal mixture film 304 and the tungsten film 305 is present over the entire surface of the semiconductor substrate prior to gate etching, electric defects caused in the gate insulating film 302A by the changing of the internal stress are increased. It may be considered that, if the heat treatment is performed at 750° C. after the gate etching process, electric defects are less likely to occur in the gate insulating film 302A since the multilayer film composed of the crystal mixture film 304 and the tungsten film 305 occupies a small area.

Although FIG. 12 shows experimental data on the process maximum temperatures in the steps of depositing the crystal mixture film 304, the tungsten film 305, and the silicon nitride film 306 and in the etching step, it will easily be appreciated that the data also holds true even when the gate electrode is formed only of the crystal mixture film composed of the mixture of the tungsten crystal and the tungsten nitride crystal, i.e., in the case of the first or second embodiment.

Although the process maximum temperature in the depositing and etching steps for forming the gate electrode has been adjusted to 400° C. in the first to third embodiments, the occurrence of electric defects in the gate insulating film can be suppressed if the process maximum temperature is 500° C. or lower.

EMBODIMENT 4

Figure 13A:
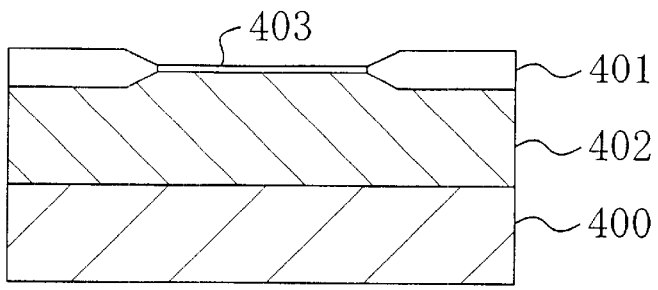
FIGS. 13(a) to (d) are cross-sectional views illustrating the individual process steps of a method of fabricating a semiconductor device according to a fourth embodiment of the present invention.
Figure 14A:
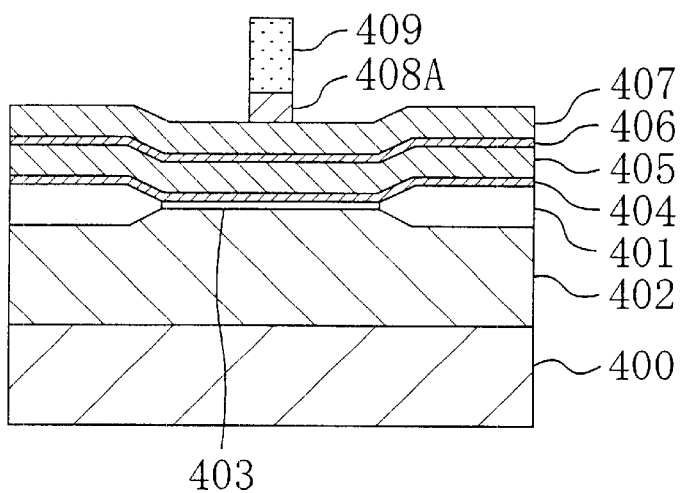
FIGS. 14(a) to (c) are cross-sectional views illustrating the individual process steps of the method of fabricating the semiconductor device according to the fourth embodiment.

Referring to FIGS. 13(a), (b), (c), and (d) and FIGS. 14(a), (b), and (c), a semiconductor device according to a fourth embodiment of the present invention and a fabrication method therefor will be described.

First, as shown in FIG. 13(a), an insulating film 401 for isolation and a p-type semiconductor region 402 are formed successively in a surface portion of a semiconductor substrate 400 made of silicon. A silicon oxynitride film 403 having a thickness of about 3.5 nm and serving as a gate insulating film is then formed on the region of the semiconductor substrate 400 surrounded by the insulating film 401 for isolation.

Figure 13B:
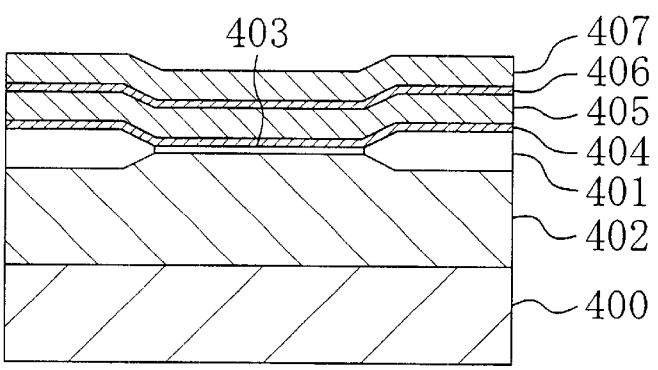

Next, a target made of tungsten is sputtered in an ambient of a gas mixture of an argon gas and a nitrogen gas in which the proportion of the nitrogen gas is, e.g., 60%, while the semiconductor substrate 400 is held at about 200° C. whereby the silicon oxynitride film 403 is nitrided again and a first crystal mixture film 404 composed of a mixture of a tungsten crystal and a tungsten nitride crystal and having a thickness of 10 nm is deposited over the entire surface of the semiconductor substrate 400, as shown in FIG. 13(b). Thereafter, the target made of tungsten is sputtered in an ambient of the argon gas, while the semiconductor substrate 400 is held at about 200° C., whereby a first tungsten film 405 having a thickness of 50 nm is deposited over the entire surface of the first crystal mixture film 404.

Next, the target made of tungsten is sputtered in the ambient of the gas mixture of the argon gas and the nitrogen gas in which the proportion of the nitrogen gas is, e.g., 60%, while the semiconductor substrate 400 is held at about 200° C., whereby a second crystal mixture film 406 composed of the mixture of the tungsten crystal and the tungsten nitride crystal and having a thickness of 10 nm is deposited over the entire surface of the semiconductor substrate 400. Thereafter, the target made of tungsten is sputtered in the ambient of the argon gas, while the semiconductor substrate 400 is held at about 200° C., whereby a second tungsten film 407 having a thickness of 50 nm is deposited over the entire surface of the second crystal mixture film 406.

In depositing the first or second crystal mixture film 404 or 406, the temperature of the semiconductor substrate 400 is preferably in the range of 200° C. to 500° C. This ensures the crystallization of tungsten and tungsten nitride composing the first and second crystal mixture films 404 and 406.

Figure 13C:
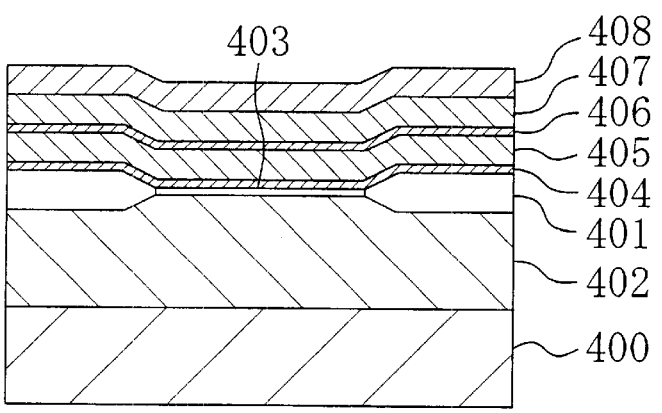

Next, as shown in FIG. 13(c), a silicon nitride film 408 is deposited over the entire surface of the second tungsten film 407 by performing, e.g., plasma CVD, while the semiconductor substrate 400 is held at 400° C.

Figure 13D:
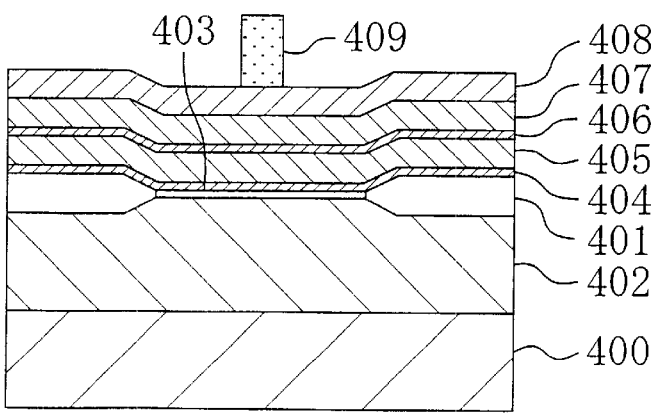
Figure 14B:
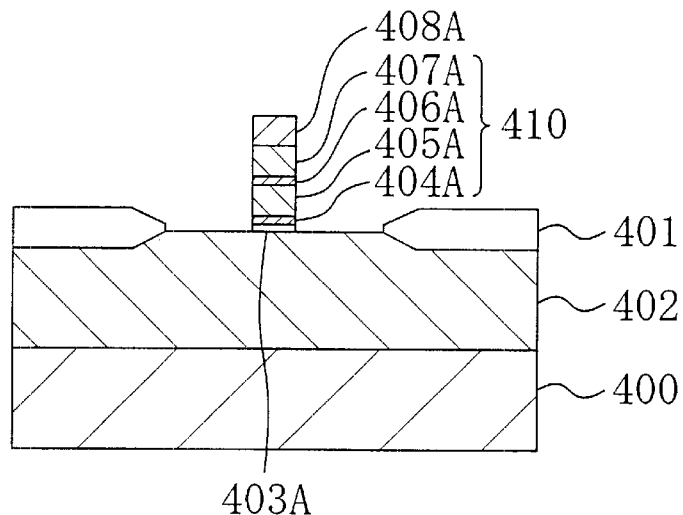
Figure 14C:
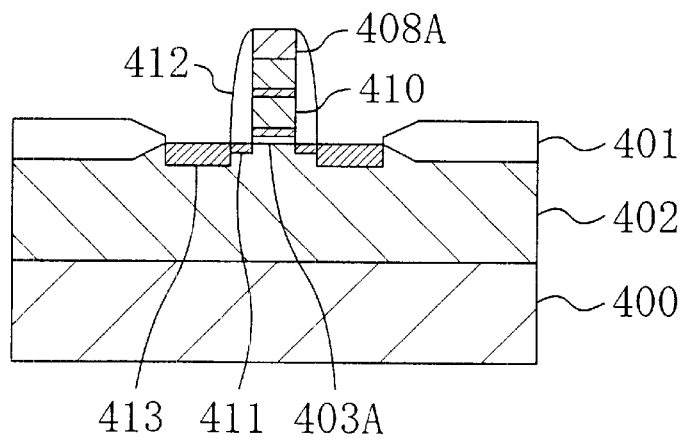
Figure 15A:
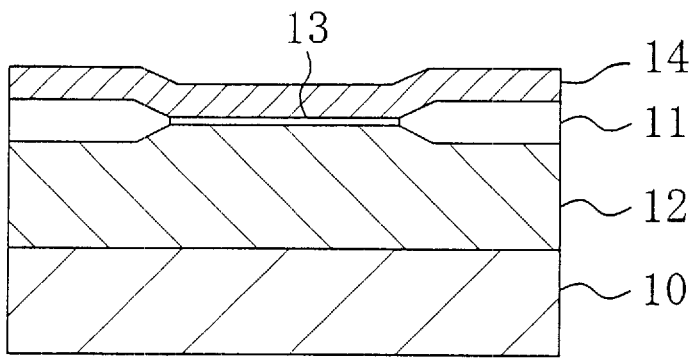
FIGS. 15(a) to (d) are cross-sectional views illustrating the individual process steps of a conventional method of fabricating a semiconductor device.
Figure 15B:
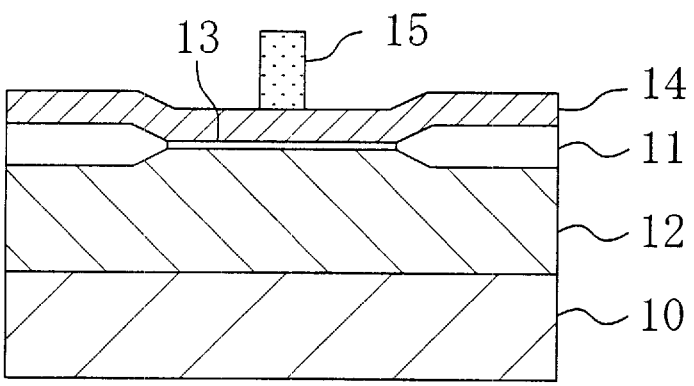
Figure 15C:
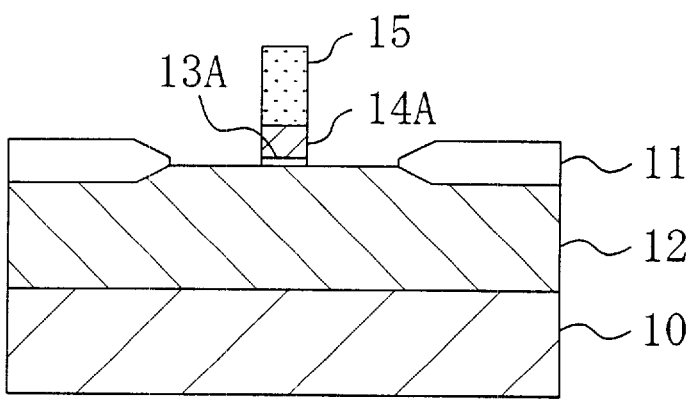
Figure 15D:
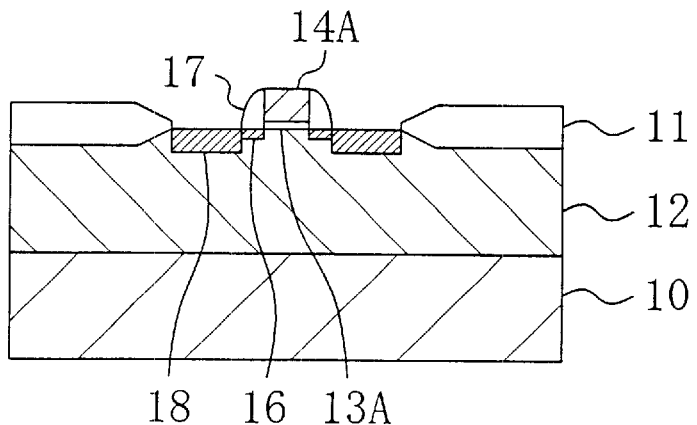
Figure 16A:
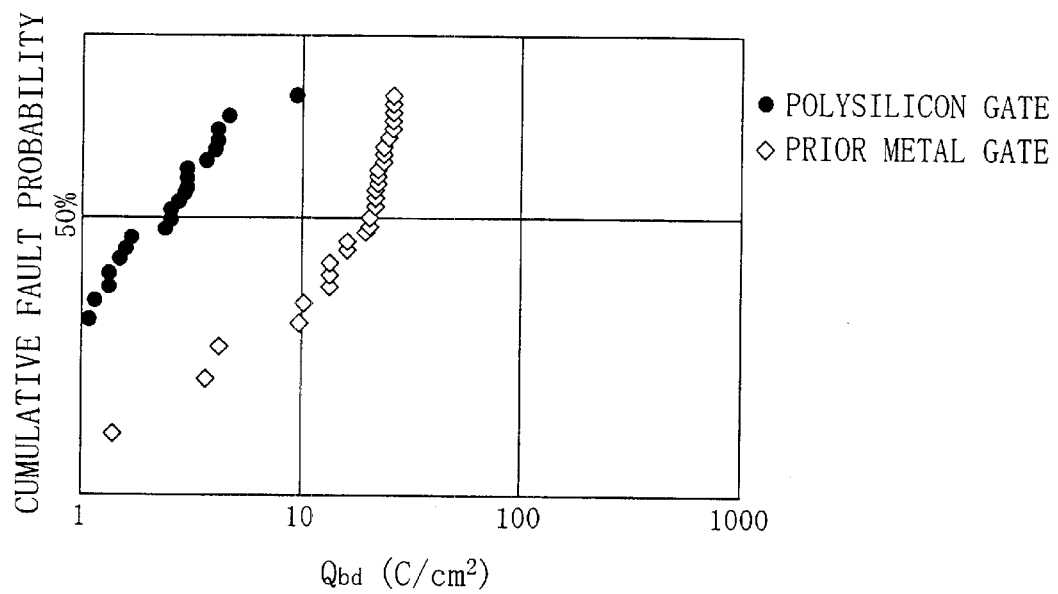
Figure 16B:
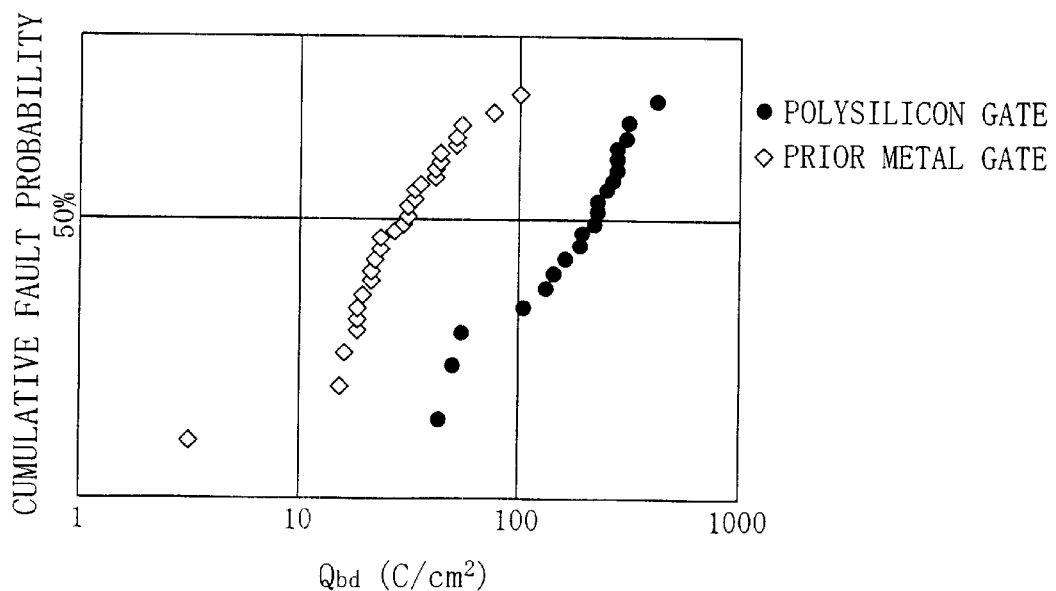

Next, as shown in FIG. 13(d), a resist pattern 409 is formed on the region of the silicon nitride film 408 in which a gate electrode is to be formed and then the silicon nitride film 408 masked with the resist pattern 409 is etched, thereby forming a mask pattern 408A composed of the silicon nitride film 408, as shown in FIG. 14(*a*).

Next, as shown in FIG. 14(*b*), the removal of the resist pattern 409 is followed by etching performed with respect to the second tungsten film 407, the second crystal mixture film 406, the first tungsten film 405, the first crystal mixture film 404, and the silicon oxynitride film 403 by using the mask pattern 408A, whereby the gate electrode 410 of an NMOS transistor composed of the patterned first and second tungsten films 405A and 407A and of the first and second crystal mixture films 404A and 406A and the gate insulating film 403A of the NMOS transistor composed of the silicon oxynitride film 403 are formed.

Next, as shown in FIG. 14(*c*), an n-type lightly doped region 411 is formed by implanting an n-type dopant by using the gate electrode 410 as a mask, followed by sidewalls 412 formed on the side surfaces of the gate electrode 410. Thereafter, the n-type heavily doped region 413 is formed by implanting an n-type dopant by using the gate electrode 410 and sidewalls 412 as a mask.

Next, an interlayer insulating film, contacts, metal wires, and the like are formed, though they are not shown in the drawing. As a result, the semiconductor device according to the fourth embodiment is obtained.

According to the fourth embodiment, the first and second crystal mixture films 404 and 406 are deposited on the upper and lower sides of the first tungsten film 405, while the second crystal mixture film 406 and the silicon oxynitride film 408 are formed on the upper and lower sides of the second tungsten film 407. This prevents crystal growth at the first and second tungsten films 405 and 407 in the step of heat treatment performed after the step of depositing the multilayer film, which is to form the gate electrode. The thickness and resistance of the gate electrode composed of one crystal mixture film having a thickness of 10 nm and one tungsten film having a thickness of 100 nm are substantially equal to those of the gate electrode composed of two crystal mixture films each having a thickness of 10 nm and two tungsten films each having a thickness of 50 nm. However, the crystal of the tungsten film having a thickness of 100 nm grows to form a grain having a diameter of about 100 nm in the subsequent heat treatment, while the crystal of the tungsten film having a thickness of 50 nm grows only to form a grain having a diameter of about 50 nm in the subsequent heat treatment.

Since the gate electrode 410 used in the fourth embodiment has the four-layer structure, the crystal growth in the heat treatment performed subsequent to the formation of the gate electrode 410 can be suppressed so that the mechanical stress exerted on the gate insulating film 403A due to the crystal growth at the gate electrode 410 is reduced. This further improves the reliability of the gate insulating film 403A.

Since the fourth embodiment has deposited the second crystal mixture film 406 composed of the mixture of the tungsten crystal and the tungsten nitride crystal in the ambient of the gas mixture of the argon gas and the nitrogen gas in which the proportion of the nitrogen gas is 60%, the weight ratio of nitrogen contained in the second crystal mixture film 406 becomes 20% or more, which is larger in amount than nitrogen contained in the first crystal mixture film 404. This further suppresses the crystal growth at the first and second tungsten films 405 and 407 deposited on the both sides of the second crystal mixture film 406.

Since the fourth embodiment has deposited the first and second crystal mixture films 404 and 406 by sputtering the target made of tungsten in the ambient of the gas mixture of the argon gas and the nitrogen gas as well as the first and second tungsten films 405 and 407 by sputtering the target made of tungsten in the ambient of the argon gas, the four-layer refractory metal film can be deposited continuously by merely changing the ambient in the chamber. This suppresses an increase in the number of fabrication process steps regardless of the four-layer structure of the gate electrode 410.

Although each of the first to fourth embodiments has formed the n-type MOS transistor by forming the n-type doped region on the p-type semiconductor region of the semiconductor substrate, it will be appreciated that a p-type MOS transistor may also be formed instead.

What is claimed is:

1. A method of fabricating a semiconductor device, comprising the steps of:

forming an insulating film, serving as a gate insulating film, on a semiconductor layer formed on a substrate; and sputtering a target made of tungsten in an ambient of a gas mixture of an argon gas and a nitrogen gas to nitride a surface region of the insulating film and deposit, on the insulating film, a crystal mixture film composed of a mixture of a tungsten crystal and a tungsten nitride crystal and composing at least a part of a gate electrode;

wherein the step of depositing the crystal mixture film is held in the ambient of the gas mixture of the argon gas and the nitrogen gas such that the weight ratio of nitrogen contained in the crystal mixture film is 10% or less.

2. The method of fabricating a semiconductor device according to claim 1, wherein the step of depositing the crystal mixture film is conducted while the substrate is held at 200° C. to 500° C.

3. The method of fabricating a semiconductor device according to claim 1, wherein the amount of nitrogen incorporated into the surface region of the insulating film during the step of depositing the crystal mixture film is 1% to 3%.

4. The method of fabricating a semiconductor device according to claim 1, further comprising, after the step of depositing the crystal mixture film, the step of sputtering the target made of tungsten to deposit, on the crystal mixture film, a tungsten film having a thickness larger than that of the crystal mixture film and composing a part of the gate electrode.

5. The method of fabricating a semiconductor device according to claim 4, further comprising, after the step of depositing the tungsten film, the step of performing a CVD or sputtering process at a temperature of 500° C. or less to deposit, on the tungsten film, an upper insulating film serving as mask pattern for forming the gate electrode.

6. The method of fabricating a semiconductor device according to claim 1, further comprising, after the step of depositing the crystal mixture film, the steps of:

sputtering the target made of tungsten in an ambient of the argon gas to deposit, on the crystal mixture film, a first tungsten film composing a part of the gate electrode;

sputtering the target made of tungsten in the ambient of the gas mixture of the argon gas and the nitrogen gas to deposit, on the first tungsten film, an upper crystal mixture film composed of the mixture of the tungsten crystal and the tungsten nitride crystal and composing a part of the gate electrode; and sputtering the target made of tungsten in the ambient of the argon gas to deposit, on the upper crystal mixture film, a second tungsten film composing a part of the gate electrode.

* * * * *